United States Patent [19]

Nola

[11] 4,384,257

[45] May 17, 1983

[54] STORAGE STABILIZED INTEGRATOR

[76] Inventor: William M. Nola, 6396 SW. 96th St., Miami, Fla. 33156

[21] Appl. No.: 268,358

[22] Filed: May 29, 1981

[51] Int. Cl.[3] .......................... G06G 7/18; H03K 17/14

[52] U.S. Cl. .......................... 328/127; 307/491; 307/553; 328/151

[58] Field of Search .......................... 328/127, 151, 163; 307/491, 552, 553, 554

[56] References Cited

U.S. PATENT DOCUMENTS

| | | | |
|---|---|---|---|
| 3,541,320 | 11/1970 | Beall | 328/151 |
| 3,654,560 | 4/1972 | Cath et al. | 307/491 |
| 3,775,692 | 11/1973 | Azegami | 328/151 |
| 3,783,393 | 1/1974 | Kakiura | 307/491 |
| 3,784,919 | 1/1974 | Azegami | 328/127 |

*Primary Examiner*—John S. Heyman
*Assistant Examiner*—Timothy P. Callahan
*Attorney, Agent, or Firm*—John Cyril Malloy

[57] ABSTRACT

An electronic integrator which is insensitive to drift because a storage and forcing circuit maintains the output voltage of the integrator at a constant level.

3 Claims, 4 Drawing Figures

STORAGE STABILIZED INTEGRATOR

BACKGROUND OF THE INVENTION

This invention relates to electronic integrators and the invention corrects for an inherent deficiency in all integrators namely drift. Drift is defined as a continuing change in the output level of the integrator whether it is at reset, ("0" volts output) or if it has integrated a signal and has an absolute voltage output. This deficiency known as drift is due to several causes and is difficult to correct primarily because of temperature changes.

DESCRIPTION OF PRIOR ART

There are several methods of correction for drift but none of these known methods have long term effects. Integrators drift primarily due to the input offset current or to leakage current in the input circuit of amplifiers. Generally, external compensation circuits can be added to offset the effects of the input deficiencies, however this compensation will be effective at only one specific temperature. If there is a change in the ambient temperature or if there is a change in the temperature of the circuitry due to normal currents in that circuit the drift will be apparent again. Drift should not be confused with offset. Offset is a fixed amount of shift in the voltage; drift is a continuous process rated, typically, in terms of millivolts per second and this means that once drift is present, it will slew the amplifier into saturation. This inherent problem limits the usefulness of present integrator circuits. This limitation is particularly a problem at very low signal levels and in applications in which an integrator must integrate a series of pulses which may be inputed over a period of time.

OBJECT OF THE INVENTION

The primary object of this invention is an integrator that is free from the primary deficiency of present integrators known as drift.

SUMMARY OF THE INVENTION

This invention embodies a feedback loop consisting of a storage circuit, a comparator circuit and a drift compensator circuit. During the integrate cycle, the output of the integrator drives a storage circuit to the same level as the integrator output. Immediately after the integrate cycle is complete the comparator circuit compares the output of the integrator and the output of the storage circuit, which initially, are exactly equal. Any change in the output of the integrator as compared to the storage circuit will cause an output of the comparator and this output driving the drift compensator will correct the integrator so that its output will equal that of the storage circuit.

DESCRIPTION OF A PREFERRED EMBODIMENT

Figure 1:
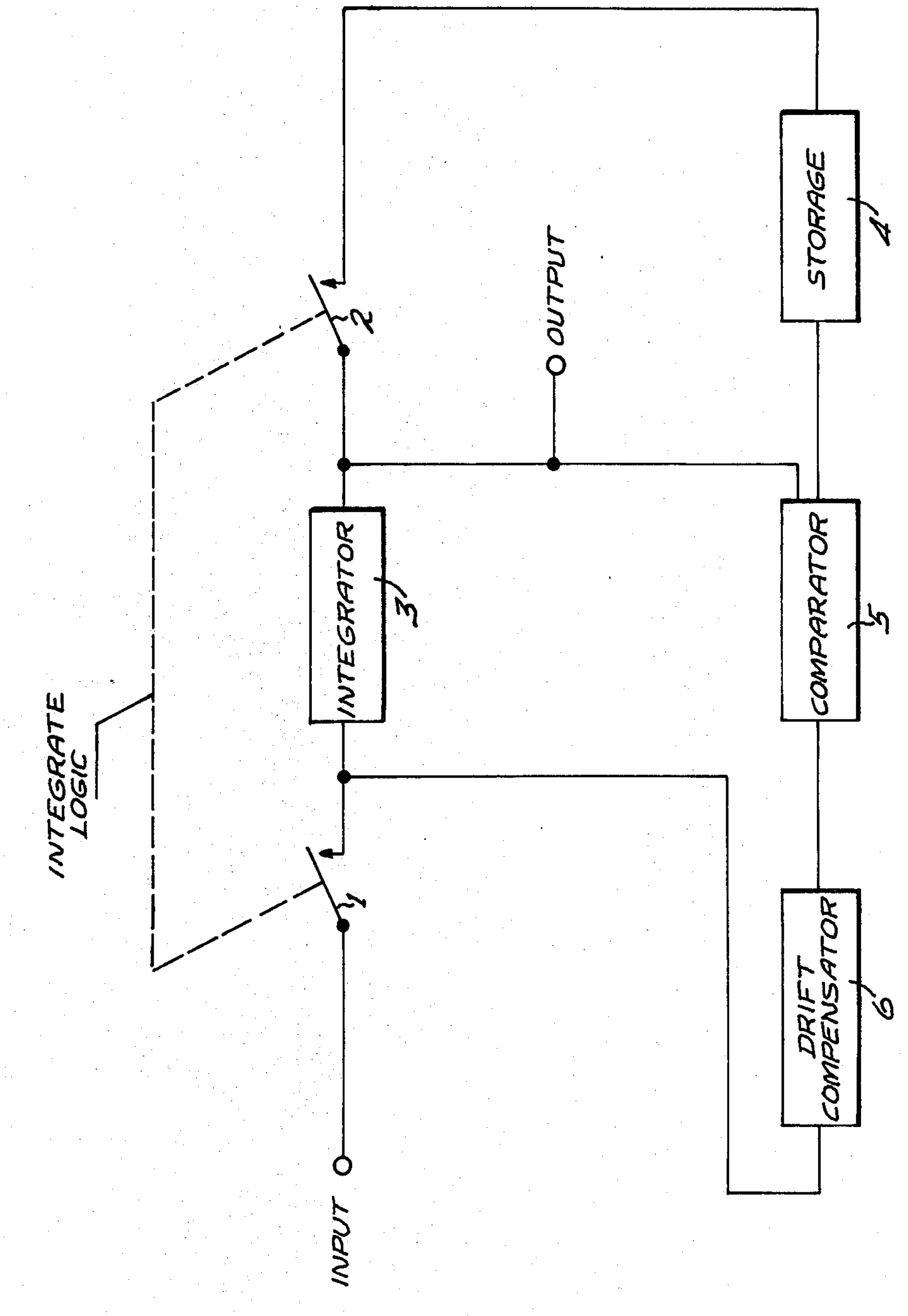
FIG. 1 is a block diagram.

The block diagram shows the basic circuit in terms of functional blocks. The switches 1 and 2 designated "integrate logic" are electronic switches normally of the field effect transistor type. During the integrate cycle both switches 1 and 2 are closed and the signal is applied to the integrator 3; the output of the integrator 3 is applied to the storage device 4. This storage device 4 is the key to the overall circuit performance. After the integrate cycle is complete the two integrate logic switches 1 and 2 open, and at this point, the output of the integrator 3 is exactly equal to the output of the storage device 4. These two outputs then drive the input of the comparator 5 and as long as the voltages are of equal magnitude the comparator 5 is off. If however, the integrator 3 starts to drift in either a positive or negative direction, the comparator 5 will develop an output which drives the drift compensator 6 to apply a voltage of proper magnitude and polarity to cause the integrator 3 output to once again match the storage device output 4.

Figure 2:
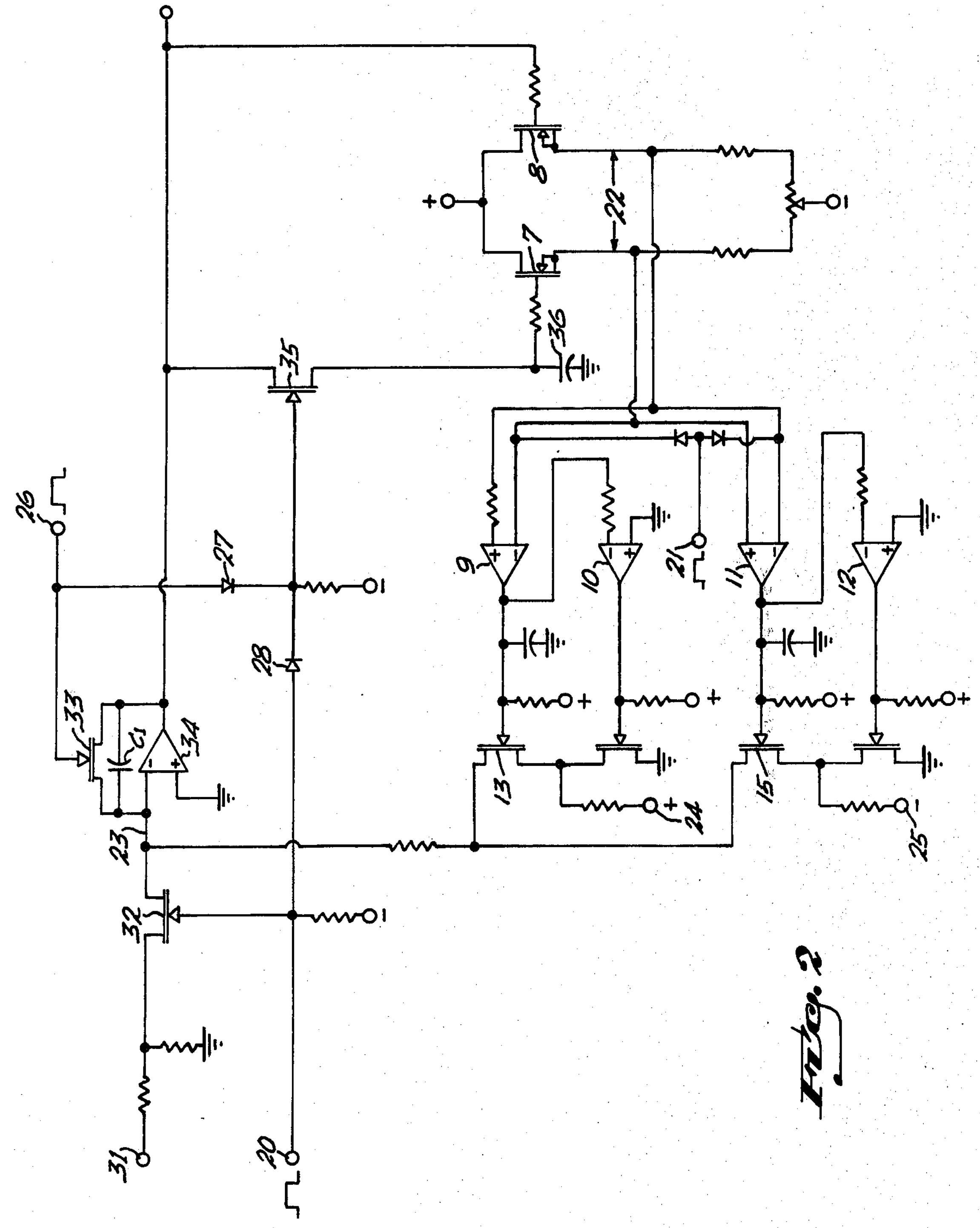
FIG. 2 is a schematic diagram of the invention.

FIG. 2 shows a practical circuit using standard electronic components. This diagram is a general purpose stabilized integrator, and it can be used to integrate an analog voltage that is developed by a transducer or by other means. The input signal to be integrated is applied at the signal input 31. At that same instant or at the beginning of the integrate cycle, the integrate logic pulse is applied at 20 and 21. This pulse turns on switch 32 and switch 35 and the positive integrate pulse 21 is applied to the input of comparators 9 and 11 so as to inhibit any compensation actions during the integrate cycle. Diode 27 prevents switch 33 from going to an on state. The integrator 34, consisting of an operational amplifier with $C_1$ connected in a negative feed back loop, will integrate the input signal. The output of the integrator 34 is then fed through switch 35 to the storage capacitor 36. The integrate cycle now being complete, causes the integrate logic 20 and 21 to return to zero causing switches 32 and 35 to go to an off state and comparators 9 and 11 to be active.

At the moment that the integrate cycle is complete, the storage capacitor 36 is now charged to the output level of the integrator but is now disconnected from the integrator. This capacitor 36 feeds the gate of the insulated gate field effect transistor (IGFET) 7. The output of the integrator 34 feeds the gate of the other IGFET 8. The two IGFETS form a bridge circuit that drive comparators 9 and 11. As long as the gates of the two IGFETS see equal voltages the IGFET bridge output 22 will be zero and this condition indicates that the integrator has not drifted.

If however, the integrator drifts either in a positive or negative direction, the voltage on the gate of IGFET 8 will differ from the stored charge of capacitor 36 feeding IGFET 7 and the bridge will become unbalanced and an output voltage 22 will appear. Depending on the polarity of this output voltage 22, comparator 9 or comparator 11 will go to an on state causing switch 13 or switch 15 to go to an on state and thus applying a voltage of proper magnitude and polarity to the input 23 of the integrator 34. This correction voltage applied to input 23 will cause the integrator output to return to a point at which it matches the stored charge on capacitor 36 at which time the bridge is again balanced and the corrective action stops. Comparators 10 and 12 operate in an opposite mode from comparators 9 and 11 and the function of comparators 10 and 12 is to ground the corrective voltage sources 24 and 25 when this corrective voltage is not required.

The integrator is now stabilized holding a constant output voltage and is waiting for the new signal to be integrated with the present integrated signal.

If a zero starting point is required, a momentary reset pulse 26 is applied to switch 33 and switch 35 and this pulse is prevented from operating switch 32 by the blocking action of diode 28. This reset pulse places switch 33 in an on state shorting capacitor $C_1$ forcing the integrator to zero and switch 35 is now on connecting storage capacitor 36 to the integrator output forcing the capacitor 36 to zero. This is the reset condition of the integrator and it is now ready for a new series of pulses.

Figures 3, 4:
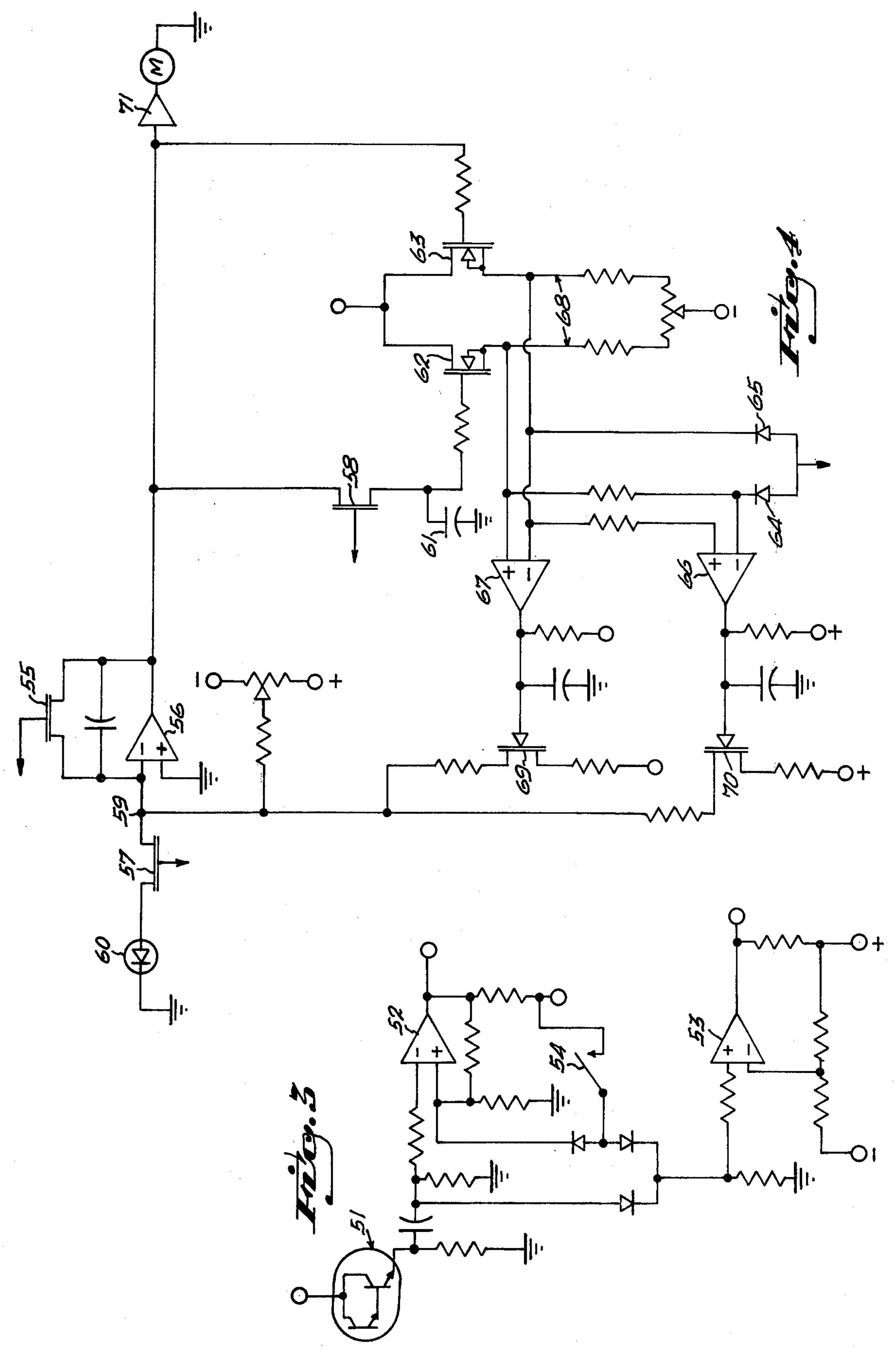
FIGS. 3 and 4 are schematic diagrams of one application of the invention.

FIGS. 3 and 4 show a practical application for the storage stabilized integrator. The triggering circuit consists of the phototransistor 51, comparator 52, and comparator 53. In the reset position, accomplished by the momentary reset switch 54, the output of comparator 52 is positive and this voltage is applied to switch 55, keeping it in an on state to establish the zero starting point of the integrator 56. The output of comparator 53 is negative and is applied to switches 57 and 58 keeping them in an off state. When a pulse of light strikes phototransistor 51 and photodiode 60, simultaneously, both devices react. The phototransistor 51 output pulse, changes the state of comparator 52 to negative thereby turning switch 55 off, unshorting the integrator 56, and the state of comparators 53 will momentarily go positively turning on switch 57 and switch 58. Photodiode 60 produces a current which passes through the momentarily closed switch 57 to charge the integrator 56. The output voltage of integrator 56 then goes through momentarily closed switch 58 to charge the storage capacitor 61. This capacitor must be a high quality type using polypropylene, polystyrene or other very low dissipation and low absorbtion type of dielectric. The output of comparator 53 is also applied to the diodes 64 and 65 which inhibits the action of comparators 66 and 67 during the integrate cycle.

At the end of the light pulse, the output of comparator 52 is latched in negative position, and the output of comparator 53 reverts back to a negative position. The negative output of comparator 53 then turns off switches 57 and 58 disconnecting the photodiode 60 from the input of integrator 56 and the storage capacitor 61 from the output of integrator 56. The corrective action to eliminate integrator drift now begins. The bridge circuit, consisting of the two devices 62, 63 insulated gate field effect transistors (IGFET), is now looking at the output of the stored charge on capacitor 61 and the output of integrator 56. If these two voltages are exactly equal, the output of the bridge 68 will be zero and no action takes place. If however, the integrator 56 output voltage begins to drift to a more negative voltage, the bridge output voltage 68 is of such a polarity to turn on comparator 67, whose output goes positive turning on switch 69, thereby applying a minute negative voltage to the integrator input 59, thus forcing the integrator back to a lessor negative output, or to a point where it will once again match the output of the storage capacitor 61. If at this point, the integrator goes less negative than desired the other comparator 66 will act causing a minute positive voltage to be applied to the integrator 56 input 59, forcing corrective action. In actual operation, the two comparators 66 and 67 pulse alternately and continuously to keep the integrator stable and drift free. A typical application would be to have the output of integrator 56 drive a log amplifier 71 and then to meter M for a final reading. This storage stabilized integrator is particularly useful in this application because the range of light to be measured could typically be 1000 to 1. This indicates that the integrator would typically be expected to be stable at voltage levels that could vary from 3 millivolts to approximately 5 volts.

At this point, the integrator 56 could integrate other pulses and add it to the first for totalizing a series of light pulses, that may occur over a period of time, or the entire circuit could be reset to zero by momentarily depressing the reset switch 54.

Thus, it is seen that this invention as described above provides a process of stabilizing an integrator circuit which is composed of the steps of: the process of stabilizing an integrator circuit comprising the steps of first, integrating a signal in an integrator circuit having an input terminal and an output terminal, second, storing the output of the integrator in a storage circuit, said storage circuit having an input and an output, comparing in a comparator means the outputs of the integrator circuit and the storage circuit, said comparator means having a first and second input terminal and an output terminal, sensing voltage differences at said first and second input terminals of said comparator means, signalling a drift compensator circuit means having an input and an output, said drift compensator circuit means comprising means to apply a voltage to said integrator to cause its output to match the output of the storage circuit, successively repeating the aforesaid process so long as the integrator is energized, said circuit including a normally open switch means to close upon a predetermined integrate signal cyclically applied to said integrator; and said circuit means including a normally open second switch means adapted to close to apply an output to the storage circuit, and simultaneously or sequentially opening said first and said second normally open switch means after each integrate cycle.

While the instant invention has been shown and described herein in what is conceived to be the most practical and preferred embodiment, it is recognized that departures may be made therefrom within the scope of the invention, which is therefore not to be limited to the details disclosed herein but is to be accorded the full scope of the claims so as to embrace any and all equivalent apparatus and articles.

What is claimed is:

1. The process of stabilizing an integrator circuit comprising the steps of:

first, integrating a signal in an integrator circuit having an input terminal and an output terminal, second, storing the output of the integrator in a storage circuit, said storage circuit having an input and an output, comparing in a comparator means the outputs of the integrator circuit and the storage circuit, said comparator means having a first and second input terminal and an output terminal, sensing voltage differences at said first and second input terminals of said comparator means, signalling a drift compensator circuit means having an input and an output, said drift compensator circuit means comprising means to apply a voltage to said integrator to cause its output to match the output of the storage circuit, successively repeating the aforesaid process so long as the integrator is energized, said circuit including a normally open switch means to close upon a predetermined integrate signal cyclically applied to said integrator; and said circuit means including a normally open second switch means adapted to close to apply an output to the storage circuit, and simultaneously or sequentially opening said first and said second normally open switch means after each integrate cycle.

2. An integrator stabilizing circuit having a main input terminal and a main output terminal, said integrator stabilizing circuit comprising, an integrator means having an input and an output, first conductor means electrically connecting the input of the integrator and the main input, first normally open switch means in the first conductor means, a storage circuit means having an input, second conductor means electrically connecting the output of the integrator and the input of the storage circuit means, a comparator having an output and a first and second input, third conductor means interconnecting said first input with the output of said integrator and fourth conductor means interconnecting the output of said storage means and the second input of said comparator means, drift compensator having an input and an output, fifth conductor means connecting the output of the comparator and the input of the drift compensator means, sixth conductor means connecting the output of the drift compensator and the input of the integrator, second normally open switch means in the second conductor neans, and means to close the first and second switch means comprising an integrate logic circuit.

3. The device as set forth in claim 2 wherein said means to close comprises means to simultaneously or sequentially close said first and second switch means.

* * * * *